United States Patent
Yang et al.

(10) Patent No.: US 6,200,100 B1
(45) Date of Patent: Mar. 13, 2001

(54) METHOD AND SYSTEM FOR PREVENTING INCONTINENT LIQUID DRIP

(75) Inventors: Qinghai Yang, Ichikawa; Hirosuke Yamada, Ibaraki-ken; Kazuya Tamura, Soka; Nobuhiro Fujiwara, Ibaraki-ken, all of (JP)

(73) Assignee: SMC Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/397,523

(22) Filed: Sep. 17, 1999

(30) Foreign Application Priority Data

Sep. 25, 1998 (JP) .................................................. 10-271333
Aug. 26, 1999 (JP) .................................................. 11-240557

(51) Int. Cl.[7] .................................................. F04B 49/00
(52) U.S. Cl. ............................. 417/26; 417/53; 239/119
(58) Field of Search .................. 417/26, 53; 239/119; 347/65; 396/611; 346/1.1

(56) References Cited

U.S. PATENT DOCUMENTS

| | | | |
|---|---|---|---|
| 4,463,359 | * | 7/1984 | Ayata et al. ........................... 346/1.1 |
| 5,854,953 | * | 12/1998 | Semba .................................. 396/611 |
| 5,938,119 | * | 8/1999 | Yamada et al. ....................... 239/119 |
| 5,971,296 | * | 10/1999 | Fukano et al. ........................ 239/119 |
| 5,988,524 | * | 11/1999 | Odajima et al. ...................... 239/119 |
| 5,992,984 | * | 11/1999 | Imanaka et al. ........................ 347/65 |
| 6,000,629 | * | 12/1999 | Tamura et al. ........................ 239/119 |
| 6,092,782 | * | 7/2000 | Yamada et al. ................... 251/129.04 |

FOREIGN PATENT DOCUMENTS 11-30355    2/1999   (JP) .

* cited by examiner

*Primary Examiner*—Timothy S. Thorpe
*Assistant Examiner*—Ehud Gartenberg
(74) *Attorney, Agent, or Firm*—Oblon, Spivak, McClelland, Maier & Neustadt, P.C.

(57) ABSTRACT

A lift amount of a valve plug is controlled with respect to a period of time from valve-closing operation instruction time for an electric opening/closing valve to arrival at a preset quick valve-closing operation position at which a flow line of a fluid discharged from a discharge port of a nozzle is in a constricted state, in accordance with a driving action of an electric actuator. The valve plug of the electric opening/closing valve is controlled to be at a closed position after the arrival at the quick valve-closing operation position. Accordingly, it is possible to prevent the incontinent liquid drip from the nozzle during the valve-closing operation of the electric opening/closing valve.

17 Claims, 17 Drawing Sheets

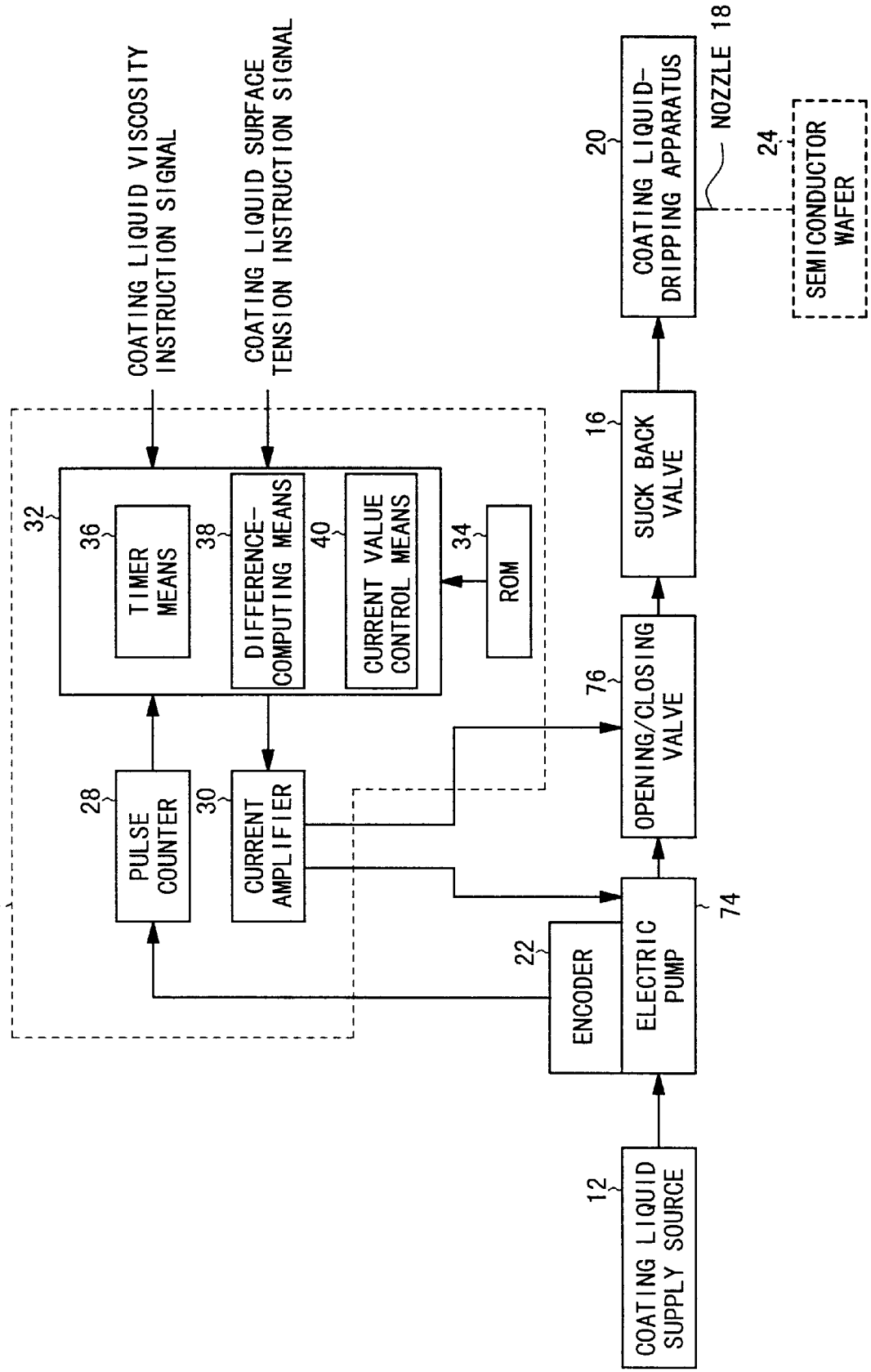

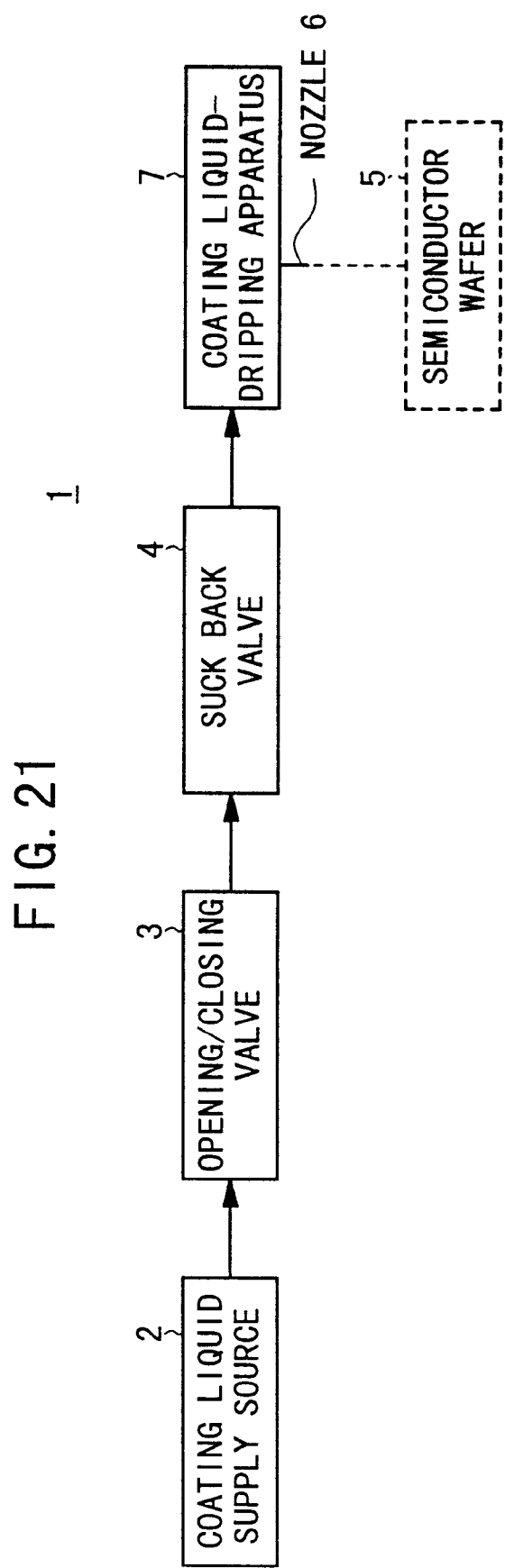

METHOD AND SYSTEM FOR PREVENTING INCONTINENT LIQUID DRIP

BACKGROUND OF THE INVENTION

1. Field of the Invention

The present invention relates to a method and a system for preventing incontinent liquid drip, in which any incontinent liquid drip of a coating liquid toward a semiconductor wafer can be reliably prevented by controlling the flow rate of the coating liquid, for example, when the supply of the coating liquid to be applied to the semiconductor wafer is stopped.

2. Description of the Related Art

The uniformity of the film thickness of the coating liquid (resist liquid) is an important factor of the product quality as the pattern becomes fine in the production steps for the semiconductor wafer. Therefore, the so-called incontinent liquid drip, in which a minute amount of coating liquid drips toward the semiconductor wafer from a nozzle as a supply port for the coating liquid when the supply of the coating liquid to the semiconductor wafer is stopped, is prevented, because of the following reason.

That is, when the supply of the coating liquid to the semiconductor wafer is stopped, if the incontinent liquid drip occurs to drip the minute amount of coating liquid from the nozzle, then the uniformity of the thickness of the film formed on the semiconductor wafer is deteriorated, resulting in a defective product.

As shown in FIG. 21, a coating liquid supply system 1 concerning the conventional technique comprises a coating liquid supply source 2, an opening/closing valve 3 connected to the coating liquid supply source 2, and a suck back valve 4. A coating liquid-dripping apparatus 7, which is provided with a nozzle 6 for dripping a predetermined amount of coating liquid to a semiconductor wafer 5, is connected to the output side of the suck back valve 4. The opening/closing valve 3 functions to switch the supply state and the supply stop state of the coating liquid for the suck back valve 4 in accordance with the valve-opening or valve-closing action. The suck back valve 4 functions to suck the coating liquid existing in the nozzle 6 in accordance with the action of negative pressure so that the incontinent liquid drip from the nozzle 6 toward the semiconductor wafer 5 is prevented.

In the conventional technique, a skilful operator works to prevent the incontinent liquid drip of the coating liquid from the nozzle 6 toward the semiconductor wafer 5 by finely adjusting the operation timing and the operation speed of the opening/closing valve 3 and the suck back valve 4 while visually observing the incontinent liquid drip phenomenon at the forward end of the nozzle 6.

However, in the case of the coating liquid supply system 1 concerning the conventional technique, the incontinent liquid drip is prevented by delicately adjusting the operation timing and the operation speed of the opening/closing valve 3 and the suck back valve 4 while the skilful operator visually observes the incontinent liquid drip phenomenon at the forward end of the nozzle 6 on the basis of the experience and the intuition. Therefore, an inconvenience arises in that if an unexperienced operator works, then it is difficult to perform the adjustment, or a lot of time is required to perform the adjustment.

As the semiconductor wafer becomes to have a large size, a surfactant is used and added to the coating liquid in order to improve the dispersion performance of the coating liquid on the wafer surface. For this reason, the surface tension of the coating liquid is lowered, and the incontinent liquid drip tends to occur more frequently. It is demanded to prevent the incontinent liquid drip more reliably and stably.

If it is intended to prevent the incontinent liquid drip by improving the control accuracy of the suck back valve, other inconveniences occur as follows. That is, the cost of the suck back valve is increased, and the operation for adjusting the suck back valve is complicated.

SUMMARY OF THE INVENTION

A general object of the present invention is to provide a method and a system for preventing incontinent liquid drip, which make it possible to reliably and stably exclude the occurrence of incontinent liquid drip from a discharge port when the flow of liquid supplied from a liquid supply source is shut off.

A principal object of the present invention is to provide a method and a system for preventing incontinent liquid drip, which make it possible to exclude the occurrence of incontinent liquid drip irrelevant to the experience and the intuition of an operator.

Another object of the present invention is to provide a method and a system for preventing incontinent liquid drip, which make it possible to prevent the occurrence of incontinent liquid drip by performing a simple and convenient operation without increasing the cost of a suck back valve.

The above and other objects, features, and advantages of the present invention will become more apparent from the following description when taken in conjunction with the accompanying drawings in which a preferred embodiment of the present invention is shown by way of illustrative example.

BRIEF DESCRIPTION OF THE DRAWINGS

FIG. 15 shows a schematic block diagram illustrating an incontinent liquid drip-preventive system according to another embodiment of the present invention;

FIG. 21 shows a schematic block diagram illustrating a coating liquid supply system concerning the conventional technique.

DESCRIPTION OF THE PREFERRED EMBODIMENTS

Figure 1:
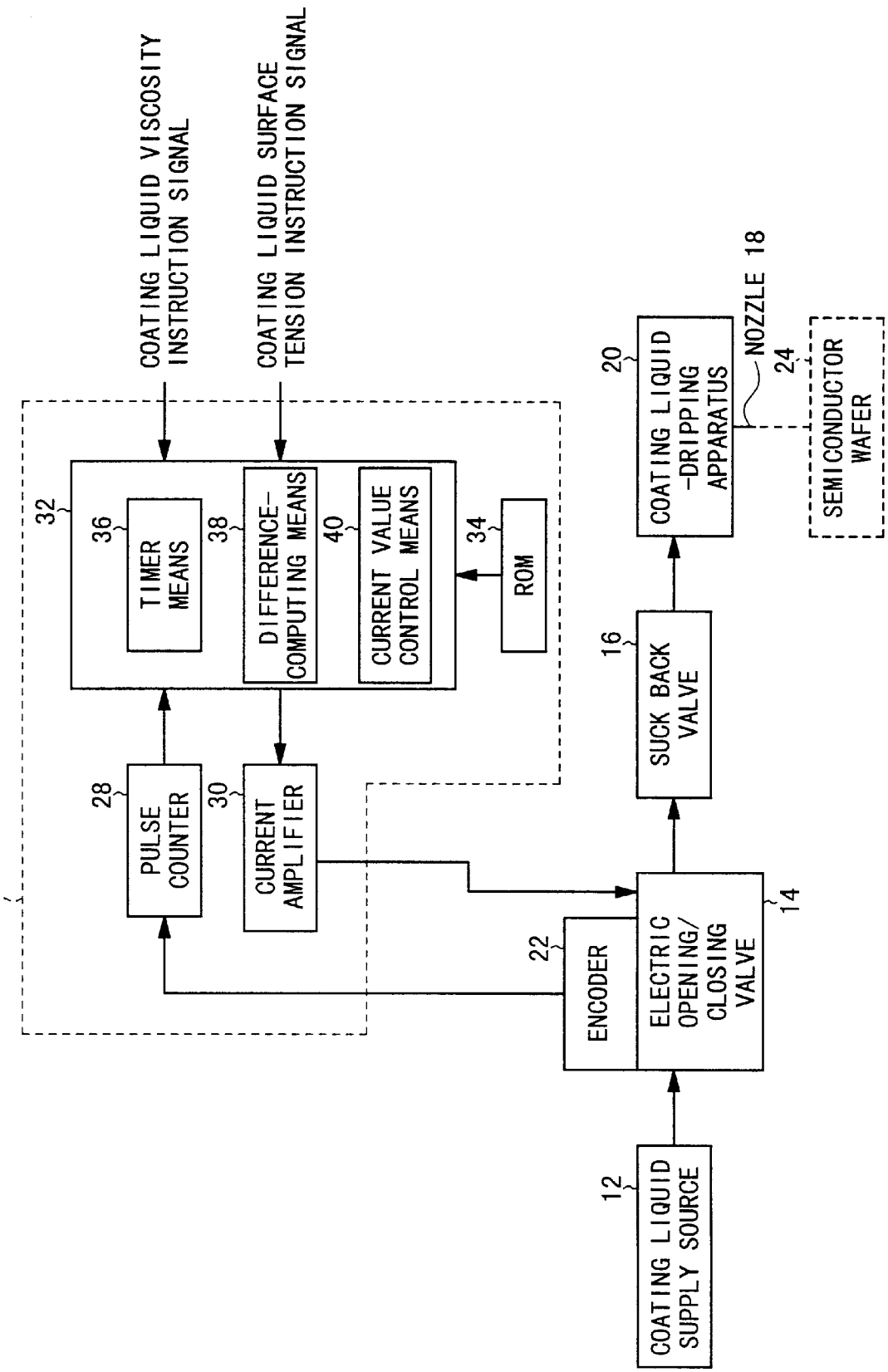
FIG. 1 shows a schematic block diagram illustrating an incontinent liquid drip-preventive system according to an embodiment of the present invention.

With reference to FIG. 1, reference numeral 10 indicates an incontinent liquid drip-preventive system according to an embodiment of the present invention.

The incontinent liquid drip-preventive system 10 comprises a coating liquid supply source 12, an electric opening/closing valve 14 and a suck back valve 16 which are sequentially connected in series to the coating liquid supply source 12, and a coating liquid-dripping apparatus 20 which is connected to an output side of the suck back valve 16 and which is provided with a nozzle 18. The electric opening/closing valve 14 includes an unillustrated valve plug for controlling the flowing coating liquid to have a predetermined flow rate by adjusting a distance of separation from a seat section, and an unillustrated electric actuator for controlling the displacement amount of the valve plug in accordance with the action of controlling the amount of electric power application. The electric opening/closing valve 14 is arranged with an encoder 22 for detecting the lift amount of the valve plug.

A system is adopted, for example, for the coating liquid supply source 12, in which the coating liquid is fed under a pressure by using the gas pressure. The flow rate of the coating liquid is controlled on the basis of the lift amount of the unillustrated valve plug arranged for the electric opening/closing valve 14 in a state of constant pressure. The electric opening/closing valve 14 is based on, for example, a driving system provided with a linear DC motor suggested by the present applicant (see Japanese Laid-open Patent Publication No. 11-30355), which is provided such that the lift amount of the valve plug is arbitrarily controllable.

An opening/closing valve based on the air operate system may be used in place of the electric opening/closing valve 14 so that the operate air pressure is arbitrarily controlled. Specifically, the control may be made on the basis of the control based on an unillustrated electropneumatic regulator or a combination of a speed controller and a switching system for a plurality of solenoid-operated valves lined in parallel.

It is allowable for the suck back valve 16 to use any of the linear DC motor or the air operate system, depending on the accuracy required for the suck back amount. The response speed of the suck back valve 16 is not a matter of importance.

A rotary plate (not shown), which is rotatable in a predetermined direction by the aid of an unillustrated rotary means, is arranged under the nozzle 18, and it is separated therefrom by a predetermined spacing distance. A semiconductor wafer 24, to which the coating liquid is applied from the nozzle 18, is placed on the rotary plate.

A control unit 26 is connected to the electric opening/closing valve 14. The control unit 26 comprises a pulse counter 28 for receiving a pulse-shaped detection signal outputted from the encoder 22 to perform the counting operation to obtain a counted value corresponding to the lift position of the valve plug, a current amplifier 30 for amplifying a current value signal to apply an amplified current to an unillustrated electromagnetic coil arranged for the electric opening/closing valve 14, ROM 34 stored with a plurality of operation control patterns (described later on) and a control program for controlling a central processing unit 32 described later on, and the central processing unit 32 for comparing the lift position of the valve plug based on the counted value obtained by the pulse counter 28 with a lift position of the valve plug based on the operation control pattern under the control of the control program store in ROM 34 to determine a difference therebetween so that a current value signal based on the difference is fed to the current amplifier 30.

The central processing unit 32 functionally comprises a timer means 36 for performing time measurement at every preset predetermined time, a difference-computing means 38 for determining, at the every predetermined time, the difference between the lift position of the valve plug based on the operation control pattern and the lift position of the valve plug based on the counted value obtained by the pulse counter 28, and a current value control means 40 for feeding the current value signal on the basis of the difference in order that the difference determined by the difference-computing means 38 is zero.

The incontinent liquid drip-preventive system 10 according to the embodiment of the present invention is basically constructed as described above. Next, its operation, function, and effect will be explained.

Figure 2:
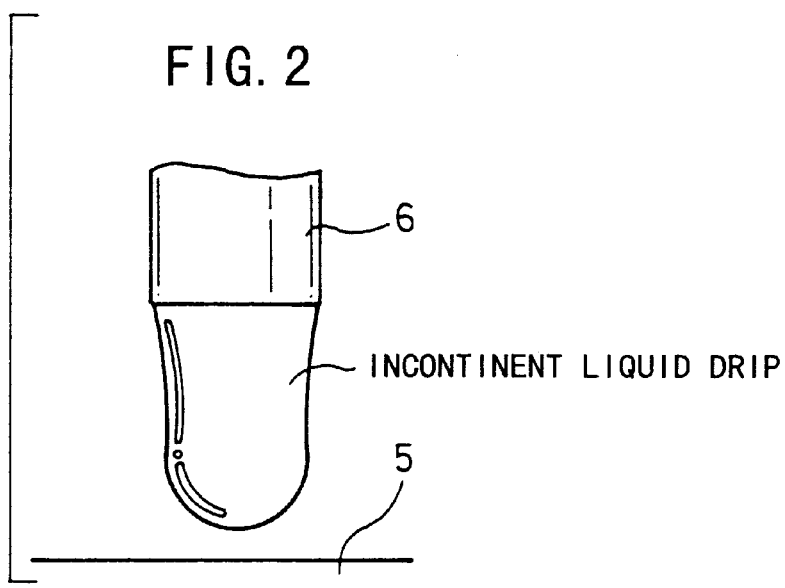
FIG. 2 is used to explain a phenomenon of occurrence of incontinent liquid drip.
Figure 3:
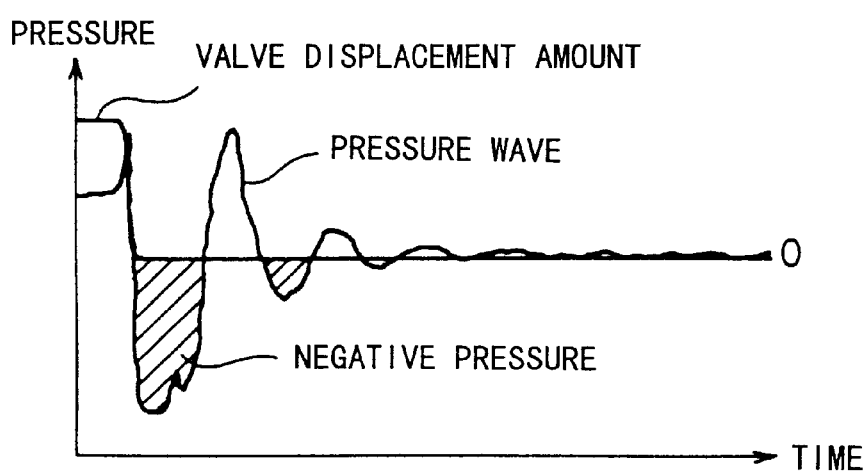
FIG. 3 is used to explain a pressure wave generated when the fluid supply is stopped.
Figure 4:
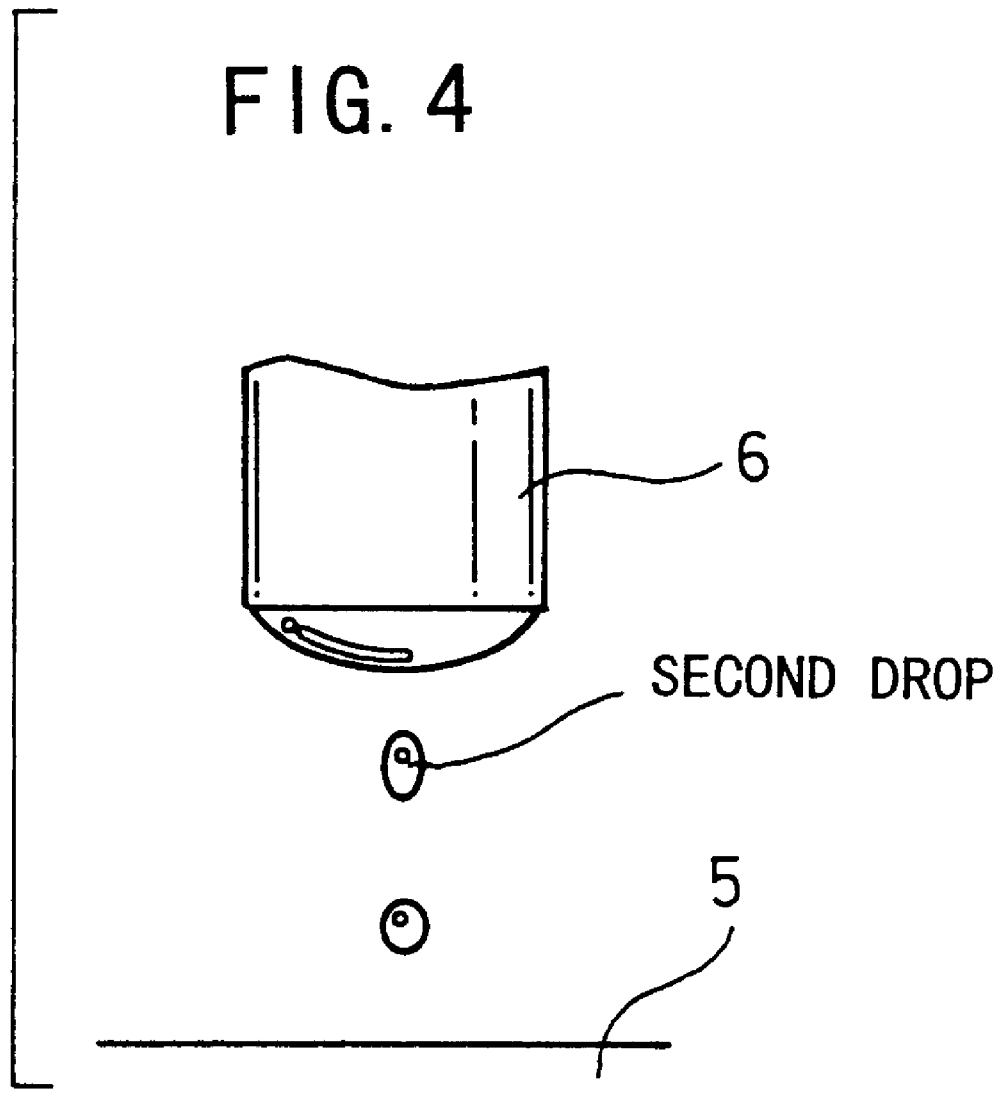
FIG. 4 is used to explain the phenomenon of occurrence of incontinent liquid drip.

At first, FIGS. 2 to 4 generally show the correlation concerning the flow line and the illustrative flow rate control, obtained by using the coating liquid supply system 1 concerning the conventional technique (see FIG. 21).

When the flow of a fluid flowing at a constant flow velocity is shut off, a predetermined flow rate change curve is obtained depending on the control medium until the flow rate is changed to be zero. As the flow rate is throttled, the fluid is affected at a higher degree by the coagulation force caused by the surface tension. Accordingly, the liquid is broken at a certain flow rate, and a discontinuous flow appears.

When the flow rate shut off operation is performed as described above, the incontinent liquid drip occurs in the following cases.

(1) When the supply of the fluid is continued even after the flow of the fluid is discontinuous and broken, then the limit volume of the liquid retained at the forward end of the nozzle 6 by the surface tension is exceeded, and the incontinent liquid drip occurs as shown in FIG. 2. The incontinent liquid drip occurs when the action of the valve position is slow over a range ranging from the flow rate region just before the discontinuous flow to the complete valve-closed state of the valve plug of the opening/closing valve 3.

(2) When the flow rate of the fluid is quickly changed, the pressure wave appears as shown in FIG. 3. The liquid is forcibly broken at the forward end of the nozzle 6 by the negative pressure generated in the foregoing process. As shown in FIG. 4, the second drops, which are produced during this process, roll on the film surface of the semiconductor wafer 5, and they adversely affect the uniformity of the film.

Therefore, in order to prevent the incontinent liquid drip, it is advantageous to eliminate the various factors as described above.

Next, explanation will be made for the operation of the incontinent liquid drip-preventive system 10 according to the embodiment of the present invention. It is assumed that in the initial state, the electric opening/closing valve 14 is in the valve-open state, and the suck back valve 16 is in the OFF state.

The coating liquid passes through the electric opening/closing valve 14 and the suck back valve 16 in accordance with the energizing action of the coating liquid supply source 12, and it is supplied to the coating liquid-dripping apparatus 20. The coating liquid is dripped to the semiconductor wafer 24 by the aid of the nozzle 18. As a result, an unillustrated coating having a desired film thickness is formed on the semiconductor wafer 24.

Figure 5:
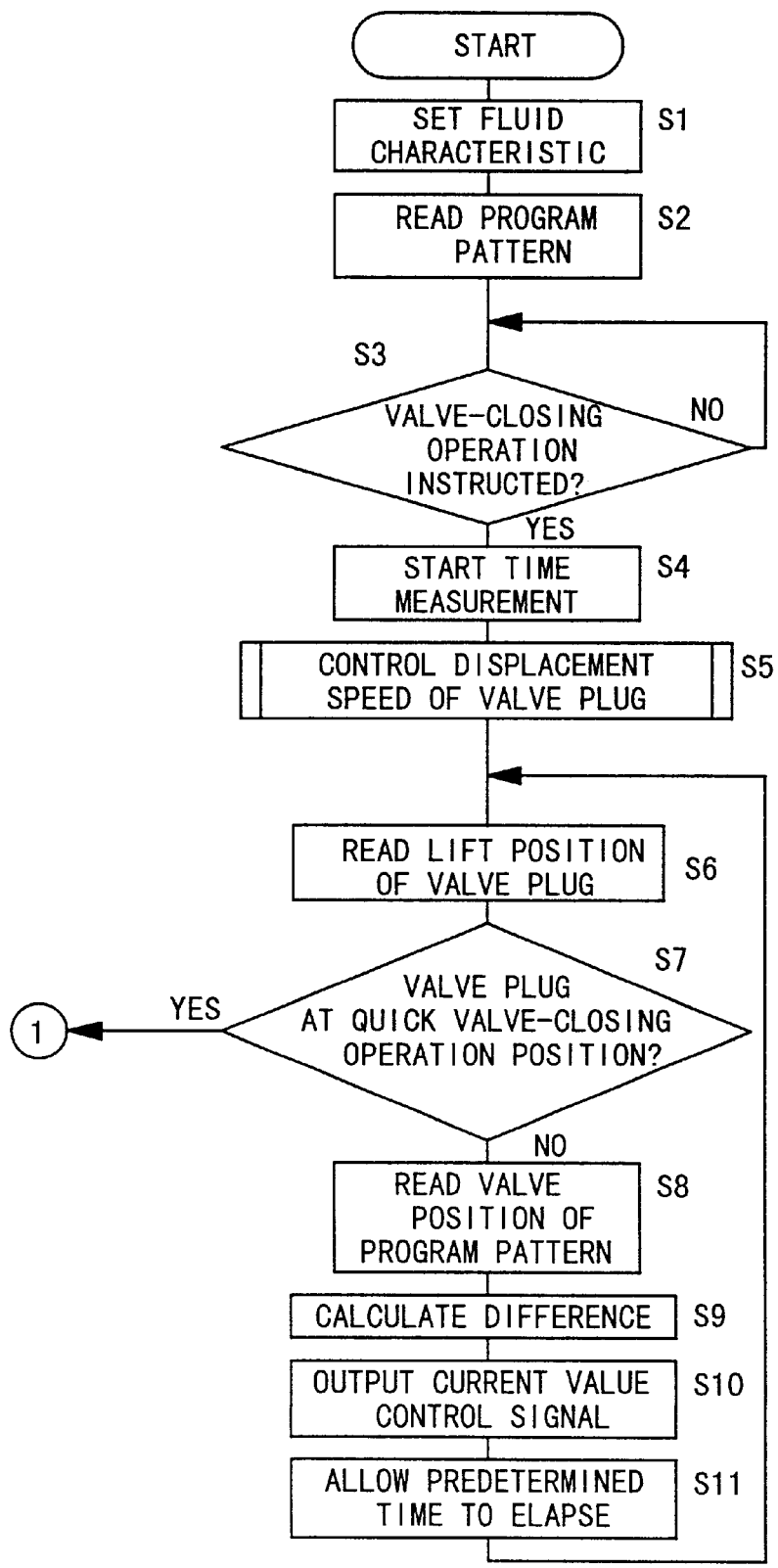
FIG. 5 shows a flow chart used to explain the operation effected when an electric opening/closing valve is closed.
Figure 6:
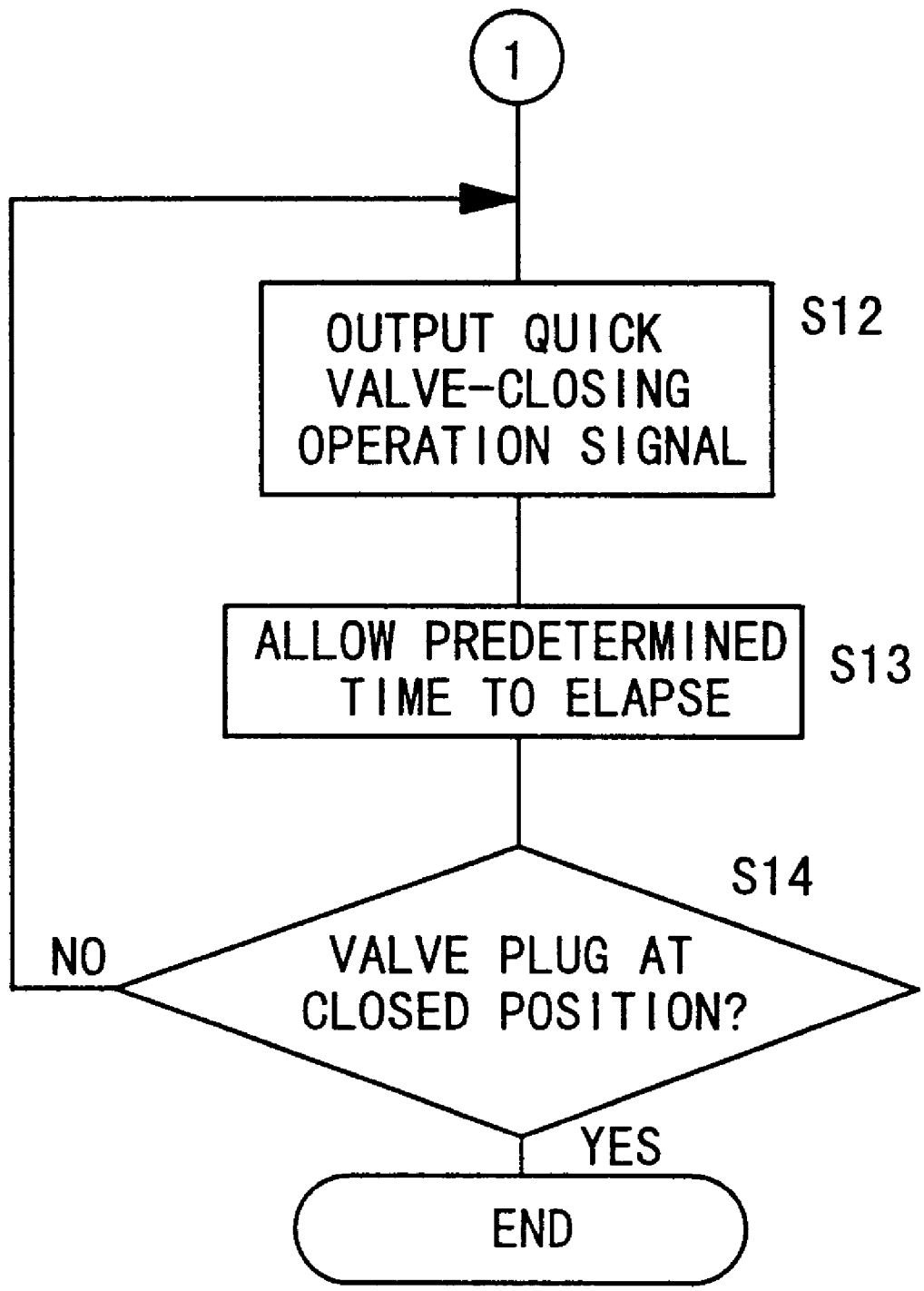
FIG. 6 shows a flow chart used to explain the operation effected when the electric opening/closing valve is closed.

Explanation will be made on the basis of a flow chart shown in FIGS. 5 and 6 for the procedure to close the electric opening/closing valve 14 in order to prevent the incontinent liquid drip from the nozzle 18 when the supply of the coating liquid is stopped.

When the valve-opening operation is instructed for the electric opening/closing valve 14, the execution of the control program is started. The viscosity instruction signal and the surface tension instruction signal, which are set for the coating liquid as the fluid, are read by the control unit 26. As a result, the fluid characteristic is set corresponding to the fluid to be used (step S1).

Specifically, the operation control pattern is affected by the viscosity and the surface tension of the coating liquid as well as the ambient temperature and the volume of the passage ranging from the electric opening/closing valve 14 via the coating liquid-dripping apparatus 20 to the forward end of the nozzle 18. However, in this embodiment, the pressure of the coating liquid fed from the coating liquid supply source 12, the ambient temperature, and the volume of the passage ranging from the electric opening/closing valve 14 via the coating liquid-dripping apparatus 20 to the forward end of the nozzle 18 are previously determined before the installation of the electric opening/closing valve 14. Therefore, it is assumed that these factors have been already reflected to the operation control pattern stored in ROM 34. Description will be made illustratively for the case to respond to only the change of the coating liquid to be used.

After the execution of the step S1, the electric opening/closing valve 14 is controlled to be in a fully open state.

After the control of the fully open state of the electric opening/closing valve 14 following the step S1, the corresponding operation control pattern is read from ROM 34 on the basis of the viscosity instruction signal and the surface tension instruction signal read for the coating liquid. The operation control pattern is transferred to unillustrated RAM, and it is stored therein (step S2).

The operation control pattern includes a flow rate control pattern for controlling the flow rate of the fluid on the basis of the opening degree of the valve, i.e., the lift amount of the valve plug with respect to the elapsed time from the valve-closing operation instruction time $t_0$.

Explanation will now be made for the operation for setting the flow rate control pattern.

Figure 7:
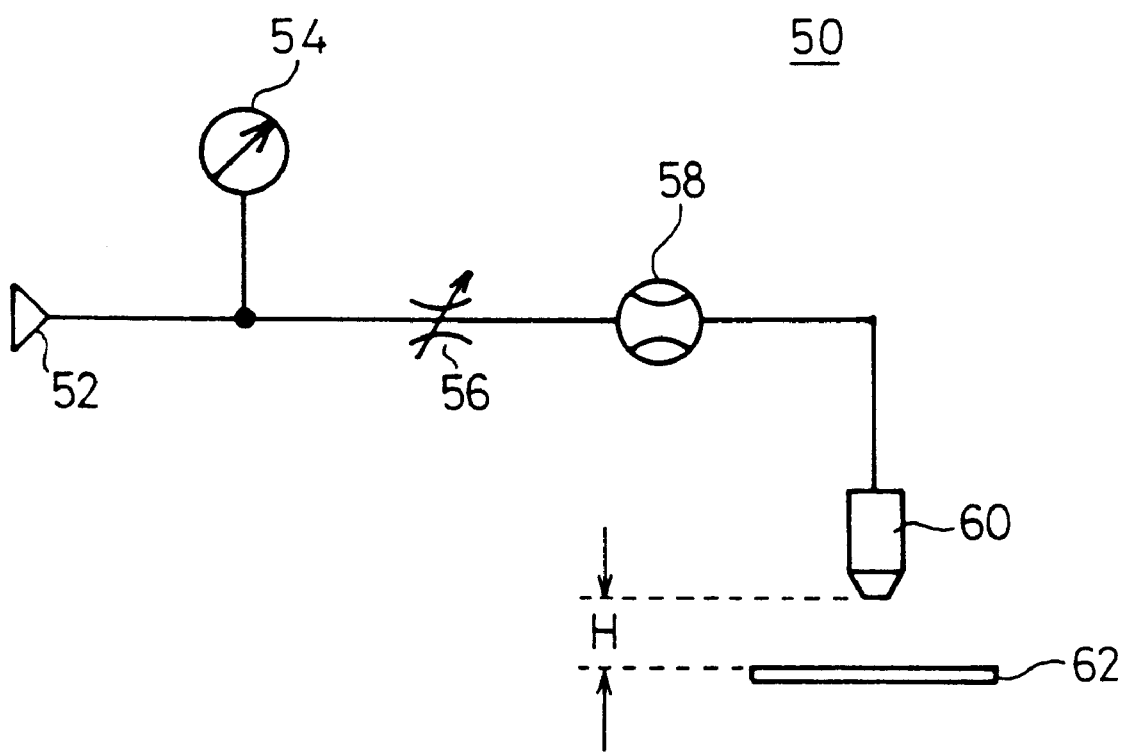
FIG. 7 schematically shows an arrangement of a test circuit used to set the quick valve-closing operation position.

A test circuit 50 as shown in FIG. 7 is assembled to definitely determine the quick valve-closing operation position of the valve plug. In FIG. 7, reference numeral 52 indicates a fluid supply source, reference numeral 54 indicates a pressure gauge, reference numeral 56 indicates a variable throttle valve, reference numeral 58 indicates a flow meter, and reference numeral 60 indicates a nozzle. In this case, the surface tension, the density, and the viscosity of the fluid are set to be under the same condition as that practically used. Further, the nozzle diameter of the nozzle 60, the spacing distance H from the nozzle 60 to the rotary plate 62, and the number of revolution of the rotary plate 62 are set to be under the same condition as that practically used as well.

A knob (not shown) of the variable throttle valve 56 is slowly rotated in a predetermined direction in a state in which the fluid is discharged from the nozzle 60 in accordance with the energizing action of the fluid supply source 52 to gradually throttle the flow rate of the fluid passing through the variable throttle valve 56. As a result, the flow rate of the fluid discharged from the forward end of the nozzle 60 is gradually decreased, giving a state in which the flow line of the liquid dripped from the forward end of the nozzle 60 is constricted (see FIG. 12). An operator reads, from the flow meter 58, an intermediate position of the flow rate region in which the flow line of the liquid is constricted to input it into the operation control pattern, while visually observing the state of constriction of the flow line of the liquid as described above. Thus, the quick valve operation position is set in the operation control pattern.

Subsequently, the flow rate control pattern is set for controlling the flow rate of the fluid flowing through the electric opening/closing valve 14 over the range in which the valve plug of the electric opening/closing valve 14 moves from the fully open state to the state of the quick valve-closing operation position. The flow rate control pattern is used to control the flow rate of the fluid flowing through the electric opening/closing valve 14 by controlling the displacement speed of the valve plug over the range in which the valve plug of the electric opening/closing valve 14 moves from the fully open position to the quick valve-closing operation position. The flow rate control pattern is set by using parameters of the acceleration "a" and the flow velocity "v" (hereinafter referred to "displacement speed "v"" as well, if necessary) of the fluid obtained by calculating the lift amount of the valve plug at a displacement speed of the valve plug at which no pressure pulsation is generated.

Figure 8:
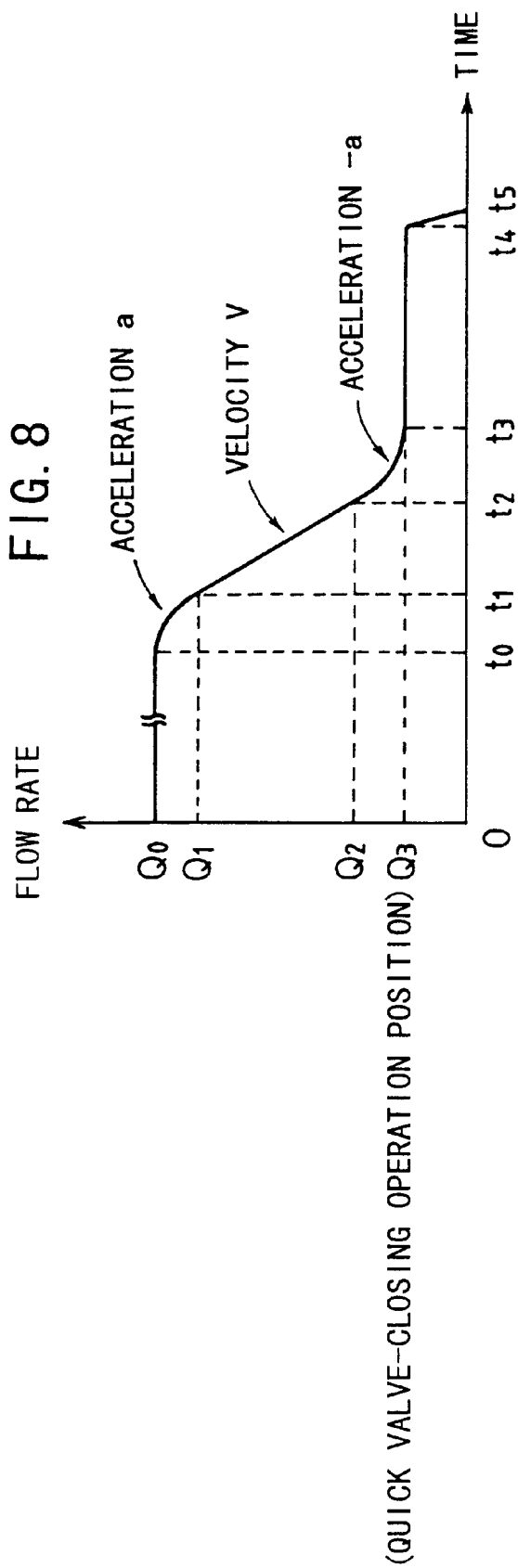
FIG. 8 is used to explain an operation control pattern.

As shown in FIG. 8, for example, the pattern is set so that the flow rate changes in a downward slanting curve to the right on the basis of the acceleration "a" from the valve-closing operation instruction time $t_0$ to the time $t_1$. The pattern is set so that the flow rate changes in a downward slanting straight line to the right on the basis of the flow velocity "v" from the time $t_1$ to the time $t_2$. The pattern is set so that the flow rate changes in an upward slanting curve to the right on the basis of the acceleration "–a" from the time $t_2$ to the time $t_3$.

Figure 9:
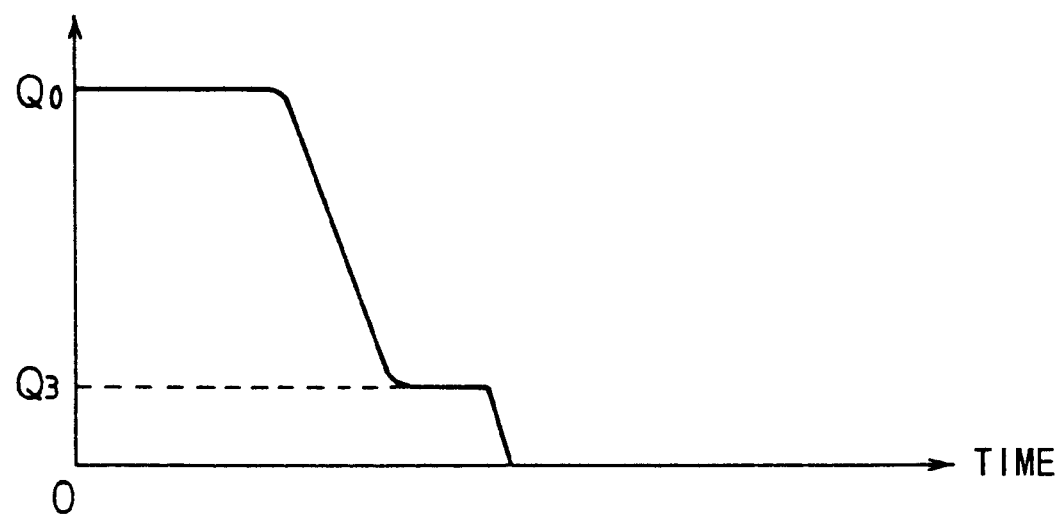
FIG. 9 is used to explain the operation control pattern.
Figure 10:
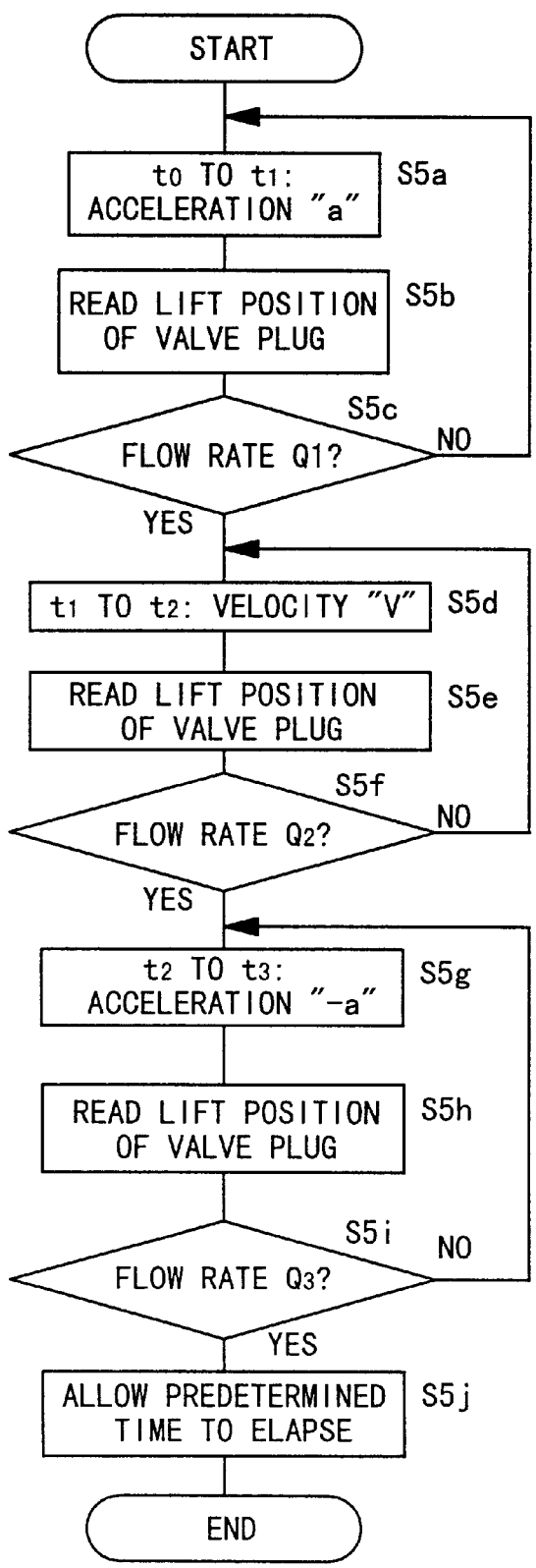
FIG. 10 shows a subroutine used to explain the operation effected when the electric opening/closing valve is closed.

During this process, attention is paid not to make the flow of the fluid discontinuous. The limit value is confirmed by using the test circuit 50. The flow rate control pattern established as described above is inputted into the operation control pattern. Practically, as shown in FIG. 9, the acceleration "a" and the flow velocity "v" are set on the basis of the preset limit value (MAX) of the parameter and the limit value (MIN) resulting from the time required for the progress to the next step. The flow rate control pattern is inputted with the acceleration "a" and the flow velocity "v" as described above.

The flow rate control pattern is subjected to the execution by using the displacement speed at which the pressure pulsation is not caused by the displacement of the valve plug. Therefore, the pressure wave as shown in FIG. 3 is suppressed. Further, the flow rate control pattern may reside in a straight line or a higher order curve. In this case, the displacement speed, at which the pressure pulsation is not caused, differs depending on the influence of the tube passage condition and the elasticity due to expansion or contraction of the tube passage.

Following the step S2, the routine waits for the valve-closing operation instruction (step S3). If the valve-opening operation instruction is given, the time measurement is started by using the timer means 36 (step S4). The displacement speed of the valve plug is controlled from the fully open position of the valve plug to the quick valve-closing operation position in accordance with the displacement speed of the valve plug at which no pressure pulsation occurs on the basis of the flow rate control pattern as described above (step S5).

That is, as shown in FIG. 8, the lift amount of the valve plug is controlled from the valve-closing operation instruction time $t_0$ to the time $t_1$ so that the flow rate changes in the downward slanting curve to the right on the basis of the preset acceleration "a" (step S5a). The lift position of the valve plug is read on the basis of the counted value supplied from the pulse counter 28 (step S5b) to check whether or not the flow rate is $Q_1$ on the basis of the lift amount of the valve plug (step S5c). If the flow rate does not arrive at $Q_1$, the routine returns to the step S5a.

After the flow rate of the fluid flowing through the electric opening/closing valve 14 within the unit time is $Q_1$ corresponding to the lift amount of the valve plug, the lift amount of the valve plug is controlled from the time $t_1$ to the time $t_2$ so that the flow rate changes in the downward slanting straight line to the right on the basis of the preset displacement speed "v" (step S5d). It is checked whether or not the flow rate is $Q_2$ on the basis of the read lift position of the valve plug (steps S5e, S5f).

Further, the lift amount of the valve plug is controlled from the time $t_2$ to the time $t_3$ so that the flow rate changes in the upward slanting curve to the right on the basis of the preset acceleration "-a" (step S5g). It is checked whether or not the flow rate is $Q_3$ on the basis of the lift position of the valve plug read from the counted value obtained by the pulse counter 28 (steps S5h, S5i).

After the flow rate is $Q_3$, the displacement of the valve plug is stopped, and the predetermined time is allowed to elapse (step S5j). The predetermined time (referring to the period of time from the time $t_3$ to the time $t_4$ shown in FIG. 8) is arbitrarily set in order to correct the response error caused, for example, by the elasticity due to expansion or contraction of the piping or the gas contaminated in the fluid. The longer the predetermined time is, the larger the allowance for the response error is.

Subsequently, it is checked whether or not the valve plug is at the quick valve-closing operation position on the basis of the lift position of the valve plug read from the counted value obtained by the pulse counter 28 (steps S6, S7). If it is judged that the valve plug does not arrive at the quick valve-closing operation position, then reference is made to the flow rate control pattern, and the lift position of the valve plug corresponding to the next time measurement timing to be effected by the timer means 36 is read from the flow rate control pattern (step S8). A difference is determined between the lift position of the valve plug read in the step S8 and the lift position of the valve plug based on the counted value obtained by the pulse counter (step S9). The current value control signal is fed to the current amplifier 30 on the basis of the difference determined in the step S9 (step S10).

The current having the current value outputted from the current amplifier 30 which has received the current value control signal is fed to the unillustrated electromagnetic coil of the electric opening/closing valve 14 to drive the valve plug in the valve-closing direction. If it is judged that the preset next time measurement timing arrives, the procedure is repeatedly executed again from the step S6 after the step S11.

The repeated execution is successively effected in a repeated manner in the valve-closing direction until it is judged in the step S7 that the valve plug arrives at the quick valve-closing operation position.

If the valve plug arrives at the quick valve-closing operation position in the step S7, the valve plug is quickly displaced in the valve-closing direction on the basis of the quick valve-closing operation signal (step S12). It is preferable that the operation for quickly displacing the valve plug in the valve-closing direction is performed by using the load mode in order to reliably obtain the seal performance effected by the valve plug. The operation is performed after the flow rate of the fluid is sufficiently throttled. Therefore, it is possible to neglect the influence on the incontinent liquid drip of the fluid.

After the passage of the predetermined time, it is checked whether or not the valve plug is reliably closed on the basis of the lift position of the valve plug. When the valve plug is seated on the seat section, the operation control pattern comes to an end (steps S13, S14).

Explanation will now be made for the incontinent liquid drip of the coating liquid in the case of the use of the electric opening/closing valve 14 subjected to the valve-closing control based on the operation control pattern.

Figure 12:
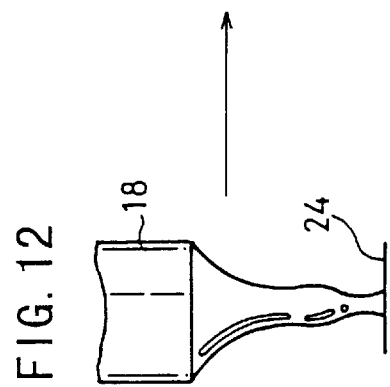
FIG. 12 illustrates a state in which the flow line of the fluid is constricted, as obtained by further throttling the flow rate of the fluid starting from the state shown in FIG. 11.
Figure 11:
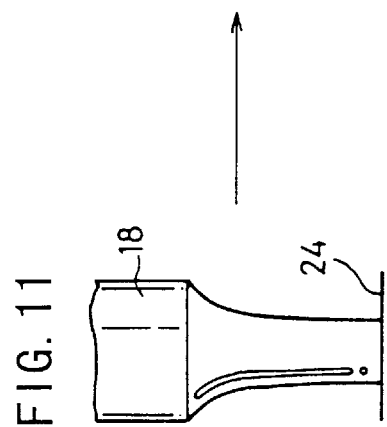
FIG. 11 illustrates a state in which the fluid is discharged from a nozzle to a semiconductor wafer.

Before the valve-closing operation is started, a state is given as shown in FIG. 11 in which the steady flow of the coating liquid is applied toward the semiconductor wafer 24. Upon the start of the valve-closing operation, the coating liquid immediately before being dripped to the semiconductor wafer 24 remains in the nozzle 18. In this state, when the lift position of the valve position is successively moved in the valve-closing direction from the fully open position of the valve plug to the quick valve-closing operation position on the basis of the preset flow rate control pattern, then the flow rate of the fluid discharged from the nozzle 18 is gradually decreased, and the flow line of the fluid discharged from the forward end of the nozzle 18 is tapered, giving a constricted state as shown in FIG. 12. That is, the flow line of the fluid discharged from the nozzle 18 is in the constricted state as a result of the arrival of the valve plug at the quick valve-closing operation position in the operation control pattern.

Figure 14:
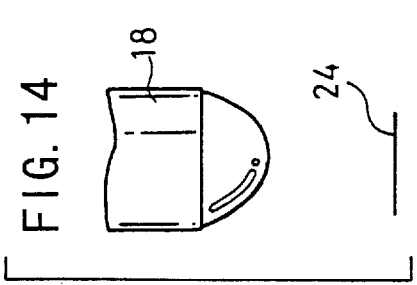
FIG. 14 illustrates a state in which the fluid separated from the semiconductor wafer is retained at the forward end of the nozzle by the aid of the surface tension.
Figure 13:
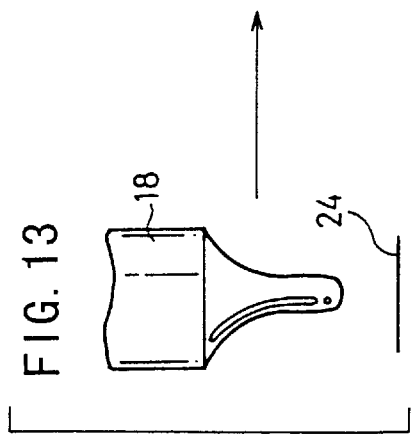
FIG. 13 illustrates a state in which the fluid dripped from the nozzle is separated from the semiconductor wafer, as obtained by closing the valve plug in the state shown in FIG. 11.

In the state in which the fluid is constricted from the forward end of the nozzle 18, the valve plug is quickly driven in the valve-closing direction to close the valve plug. Accordingly, the fluid, which is discharged from the forward end of the nozzle 18 to be in the constricted state, is separated from the semiconductor wafer 24 (see FIG. 13). Further, the fluid is retained in a substantially hemispherical shape at the forward end of the nozzle 18 (see FIG. 14). The substantially hemispherical fluid is sucked into the nozzle 18 by driving the suck back valve 16 to be in the ON state. In this procedure, the fluid is sucked such that the volume of the hemispherical fluid retained at the forward end of the nozzle 18 is balanced with the static surface tension. Therefore, no dynamic influence is exerted, and the dispersion in volume can be suppressed to be small. As a result, it is possible to increase the suction accuracy of the suck back valve 16.

As described above, the constricted state of the fluid is set as the quick valve-closing operation position on the basis of the operation control pattern, i.e., the flow rate characteristic. The displacement speed of the valve plug is controlled at the velocity at which the pressure pulsation is not caused from the time of the valve-closing operation start for the valve plug to the quick valve-closing operation position. The valve plug is quickly closed upon the arrival at the quick valve-closing operation position. According to the setting as described above, the incontinent liquid drip of the coating liquid can be excluded reliably and stably without being affected by the uncertain dynamic adjustment.

In other words, the coating liquid is sucked while making the balance with the static surface tension. Therefore, the process is not affected by any uncertain factor, for example, by any dynamic adjustment. Accordingly, it is possible to prevent the incontinent liquid drip reliably and stably.

According to the embodiment of the present invention, the occurrence of the incontinent liquid drip can be avoided by setting the operation control pattern and by effecting the convenient adjusting operation without increasing the cost of the suck back valve 16.

It is a matter of course that an electric actuator may be used for the driving section for driving the valve plug (not shown) of the electric opening/closing valve 14 such that a ball screw shaft is provided, for example, on a rotary shaft of, for example, a linear voice coil type actuator, a liner DC motor, a linear pulse motor, a rotary DC motor, or a rotary stepping motor, and the rotary motion of the ball screw shaft is converted into the rectilinear motion by using, for example, a displacement member.

Next, FIG. 15 shows an incontinent liquid drip-preventive system 70 according to another embodiment of the present invention. The same constitutive components as those of the foregoing embodiment are designated by the same reference numerals, detailed explanation of which will be omitted.

The incontinent liquid drip-preventive system 70 according to the another embodiment is different from the foregoing embodiment in that the former comprises an electric pump 74 for controlling the discharge amount of the fluid sucked from the coating liquid supply source 12 by controlling the displacement speed of a piston 72 as described later on, and an opening/closing valve 76 for shutting off the flow of the fluid discharged from the electric pump 74. The electric opening/closing valve 14 may be used as the opening/closing valve 76.

Figure 16:
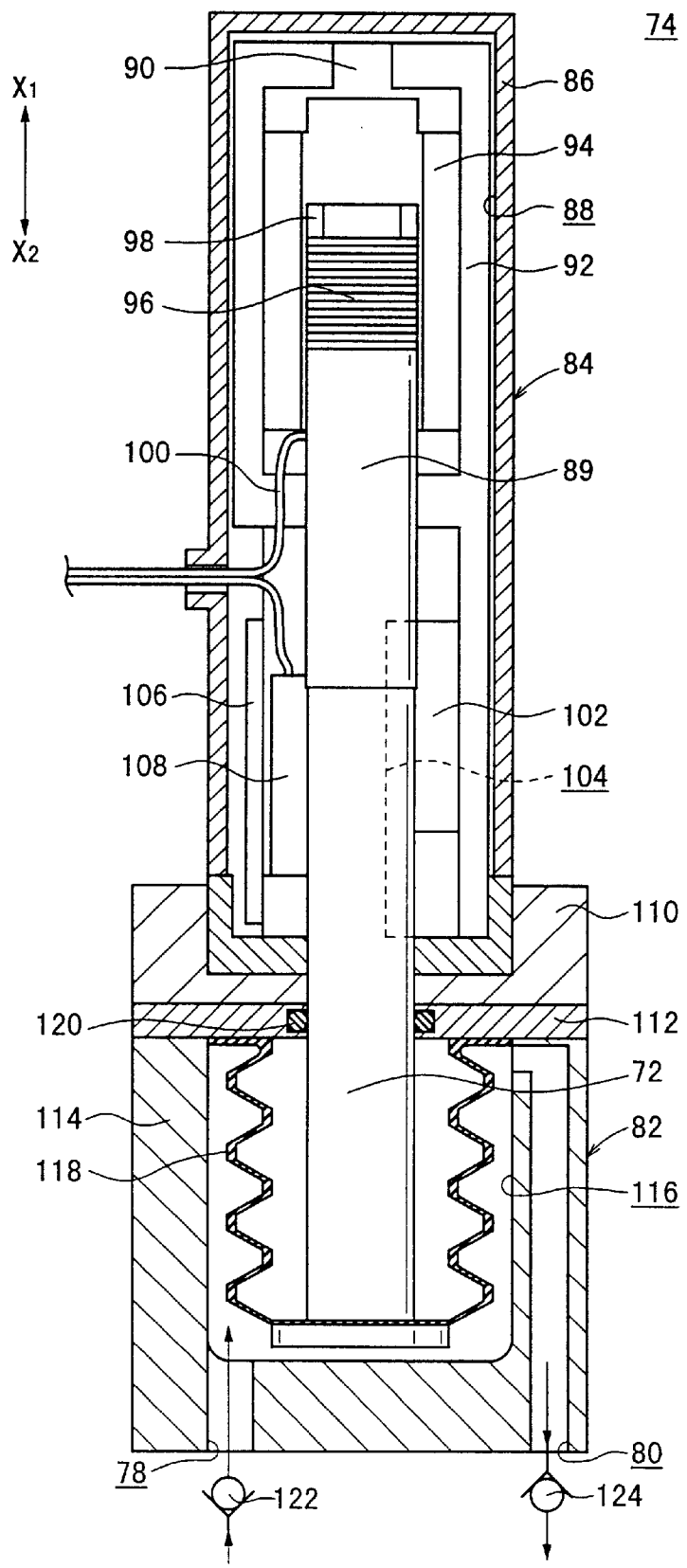
FIG. 16 shows a longitudinal cross-sectional arrangement of an electric pump for constructing the incontinent liquid drip-preventive system shown in FIG. 15.
Figure 17:
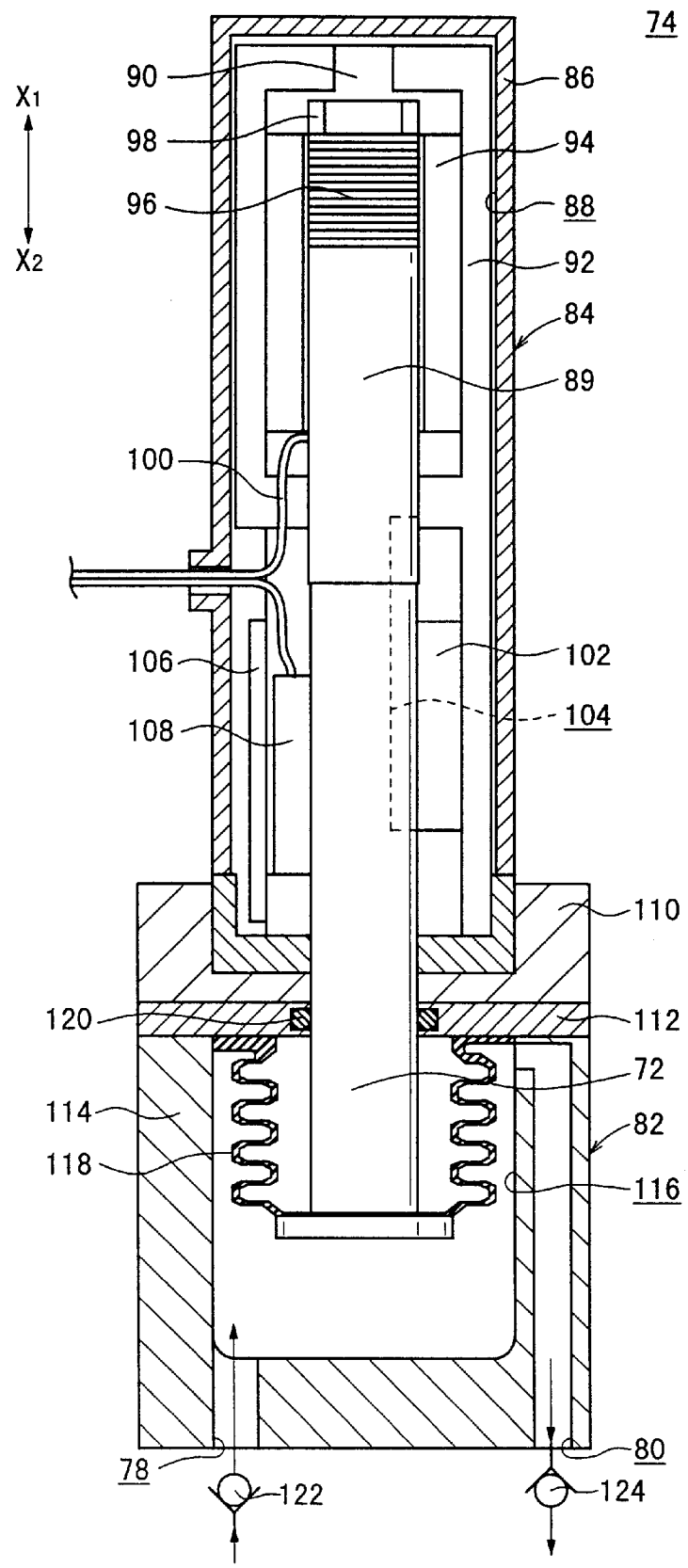
FIG. 17 shows a longitudinal cross-sectional arrangement illustrating a state in which a piston of the electric pump shown in FIG. 16 is moved upwardly.

As shown in FIGS. 16 and 17, the electric pump 74 comprises a flow rate control unit 82 formed with a suction port 78 and a discharge port 80, for controlling the flow rate of the fluid discharged from the discharge port 80 by controlling the displacement speed of the piston 72, and a driving unit 84 formed integrally with the flow rate control unit 82, for driving the piston 72.

The driving unit 84 includes a housing 86. A lengthy stem 89 is provided in a chamber 88 of the housing 86 displaceably in the direction indicated by the arrow $X_1$ and in the direction indicated by the arrow $X_2$. A fixed iron core 90 is secured to the housing 86 at an upper central portion of the chamber 88.

A fixed pole magnet 94 is provided in the chamber 88. The fixed pole magnet 94 is separated from the fixed iron core 90 by a predetermined spacing distance, and it is secured to the inner wall surface of the housing 86 by the aid of a support member 92. In this arrangement, a magnetic field is formed substantially in the horizontal direction between the fixed pole magnet 94 and the fixed iron core 90. A bobbin 98, around which an electromagnetic coil 96 is wound in a plurality of times, intervenes between the fixed iron core 90 and the fixed pole magnet 94. The bobbin 98 is provided displaceably together with the stem 89 in an integrated manner by the aid of an unillustrated connecting pin. A predetermined clearance is formed between the fixed iron core 90 and the bobbin 98. Reference numeral 100 indicates a lead wire for allowing a current to flow from the control unit 26 through the electromagnetic coil 96 in order to drive the stem 89.

A guide member 102 is provided on the inner wall surface of the housing 86 via the support member 92. The guide member 102 engages with a recess 104 of the stem 89, and thus it linearly guides the stem 89. Further, the guide member 102 functions as a stopper for regulating the displacement amount of the stem 89.

An encoder 108 is fixed via a support member 106 on the inner wall surface of the housing 86 on the side opposite to the guide member 102. The encoder 108 includes an unillustrated photosensor fixed on the side of the housing 86, and an unillustrated glass scale secured to the side of the stem 89, the glass scale having scale values formed on a glass substrate at constant intervals. In this arrangement, the displacement amount of the piston 72 which is displaced integrally with the stem 89 Is detected by the unillustrated photosensor by the aid of the glass scale. A pulse-shaped detection signal, which is outputted from the photosensor, is fed in a feedback manner through the lead wire to the control unit 26. The central processing unit 32 calculates the displacement speed of the piston 72 per unit time on the basis of the displacement amount of the piston 72 detected by the encoder 108.

The flow rate control unit 82 is formed integrally with the housing 86 via a connecting member 110 and a plate 112. The flow rate control unit 82 includes a body 114 provided with the suction port 78 and the discharge port 80, the piston 72 provided in a chamber 116 of the body 114, for making displacement in the vertical direction (direction indicated by the arrow $X_1$ or the arrow $X_2$) integrally with the stem 89, and a bellows 118 for covering the piston 72 with its first end fastened to the piston 72 and its second end secured to the plate 112. The bellows 118 is made of a flexible material such as a rubber material or a resin material. A seal member 120 for surrounding the piston 72 is installed at a sliding portion between the plate 112 and the piston 72.

A first check valve 122 for preventing the counter flow of the coating liquid sucked from the coating liquid supply source 12 is provided between the coating liquid supply source 12 and the suction port 78. A second check valve 124 for preventing the counter flow of the coating liquid discharged from the discharge port 80 is provided between the discharge port 80 and the opening/closing valve 76.

The incontinent liquid drip-preventive system 70 according to the another embodiment of the present invention is basically constructed as described above. Next, its operation, function, and effect will be explained.

At first, the operation of the electric pump 74 will be explained.

When a current is allowed to flow through the electromagnetic coil 96 by the aid of the control unit 26, the electromagnetic force is generated in the electromagnetic coil 96. The force for upwardly moving the bobbin 98 provided with the electromagnetic coil 96 wound therearound is generated in conformity with the so-called Fleming's left hand rule in accordance with the interaction between the electromagnetic force and the magnetic field formed by the fixed pole magnet 94 and the fixed iron core 90. The bobbin 98, the stem 89, and the piston 72 are moved upwardly (in the direction indicated by the arrow $X_1$) in an integrated manner. The electromagnetic force is adjustable to have a desired magnitude and a desired period of duration time by appropriately controlling the magnitude of the current allowed to flow through the electromagnetic coil 96. The direction of the electromagnetic force can be changed to the direction of the arrow $X_1$ or the direction of the arrow $X_2$ by inverting the polarity of the current allowed to flow through the electromagnetic coil 96.

The piston 72 is moved upwardly as described above, and the bellows 118 for covering the piston 72 is contracted (see FIG. 17). Accordingly, the coating liquid is sucked via the suction port 78, and the sucked coating liquid is charged in the chamber 116.

On the other hand, the piston 72 is lowered (in the direction indicated by the arrow $X_2$) by inverting the positive and negative polarities of the current allowed to flow through the electromagnetic coil 96. The coating liquid, which is charged in the chamber 116, is supplied via the discharge port 80 to the opening/closing valve 76. A predetermined amount of the coating liquid is dripped toward the semiconductor wafer 24 from the nozzle 18 of the coating liquid-dripping apparatus 20.

Next, explanation will be made for the method for preventing the incontinent liquid drip from the nozzle 18 when the supply of the coating liquid is stopped in the another embodiment.

In the case of the foregoing embodiment based on the use of the electric opening/closing valve 14, the lift amount of the valve plug is controlled until the arrival at the quick valve-closing operation position on the basis of the operation control pattern. On the other hand, the another embodiment, which is based on the use of the electric pump 74, is different from the foregoing embodiment in that the displacement speed of the piston 72 of the electric pump 74 is controlled so that the flow line of the fluid discharged from the nozzle 18 is in the constricted state on the basis of the operation control pattern. The incontinent liquid drip from the nozzle 18 can be prevented by quickly displacing the unillustrated valve plug of the opening/closing valve 76 to give the valve-closed state after the flow line of the fluid discharged from the nozzle 18 is in the constricted state.

Figure 18:
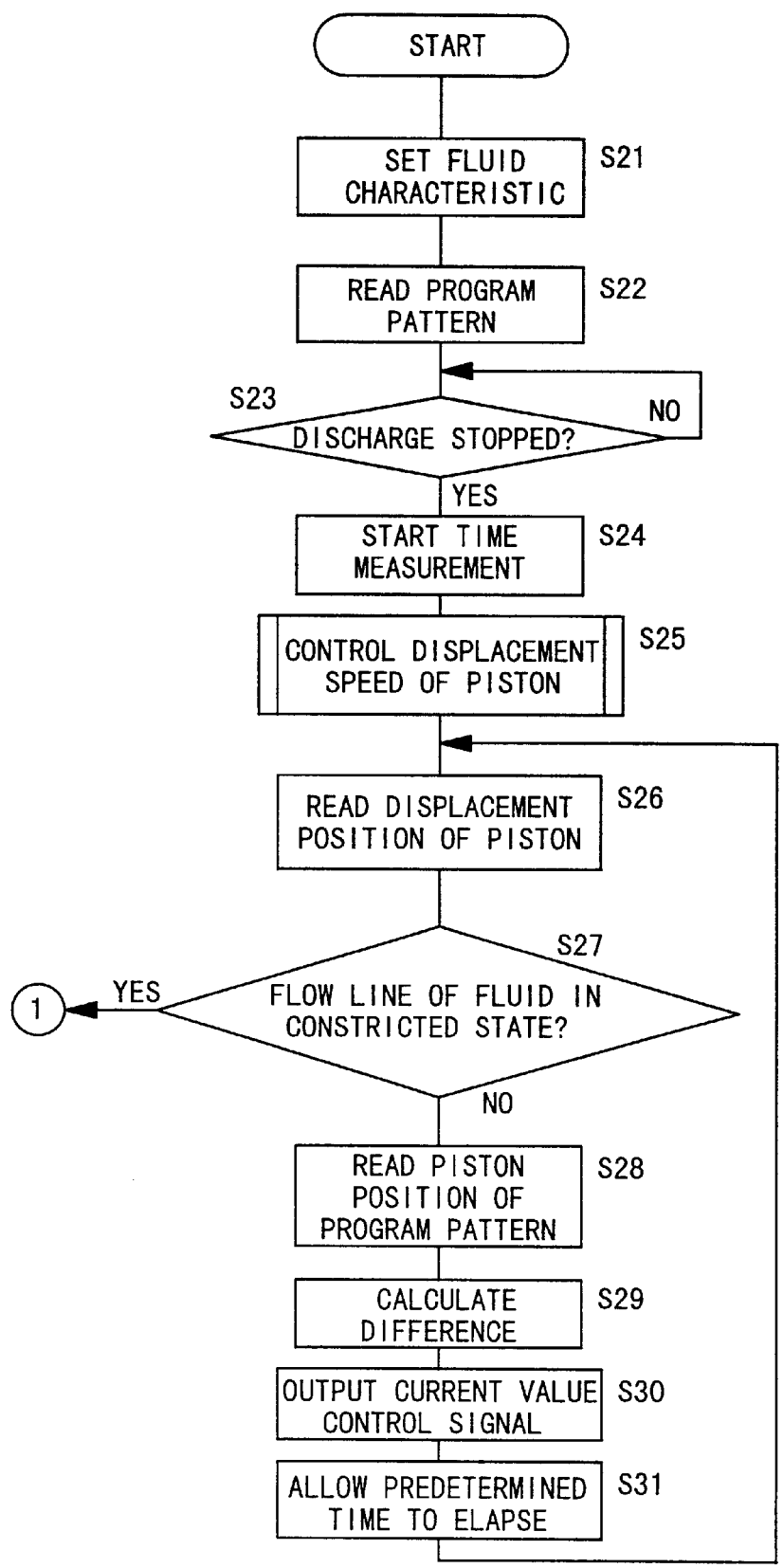
FIG. 18 shows a flow chart used to explain the prevention of incontinent liquid drip by controlling the displacement speed of the piston of the electric pump.
Figure 19:
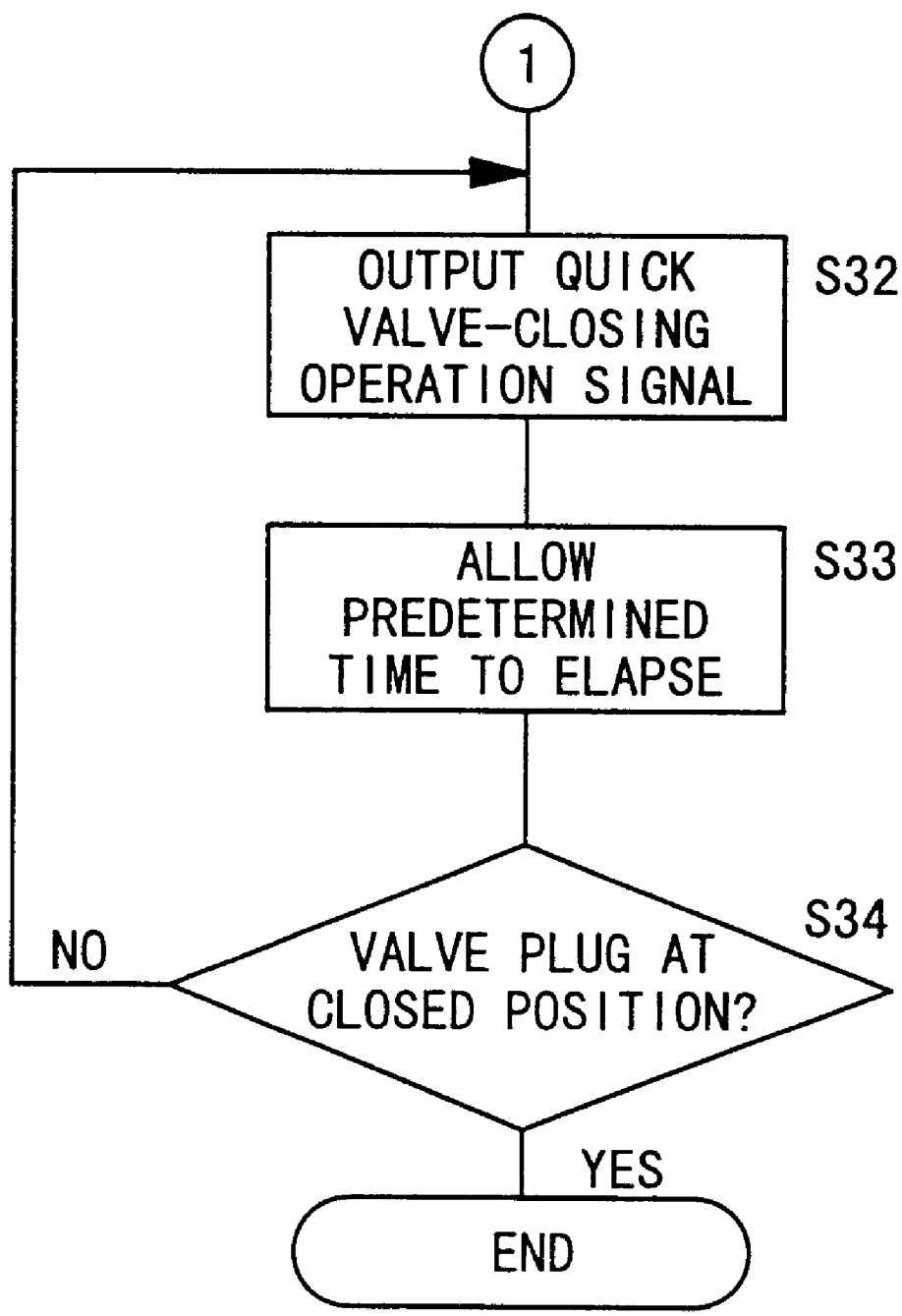
FIG. 19 shows a flow chart used to explain the prevention of incontinent liquid drip by controlling the displacement speed of the piston of the electric pump.
Figure 20:
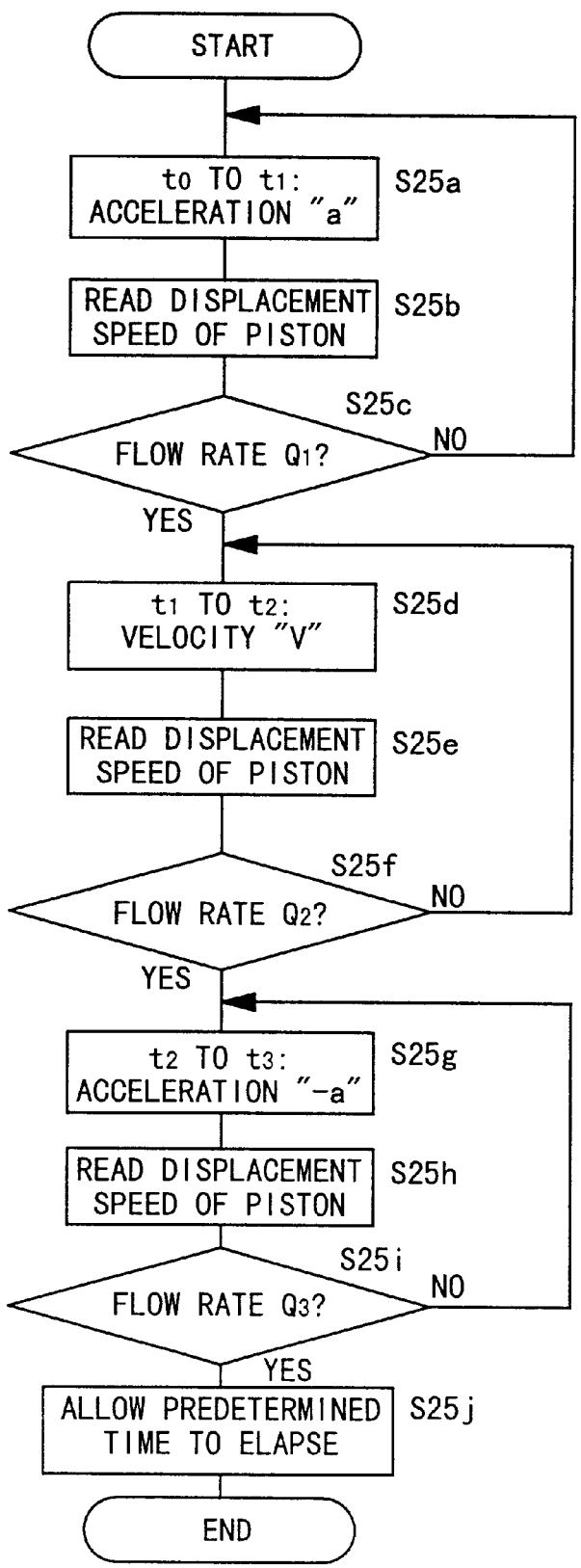
FIG. 20 shows a subroutine used to explain the prevention of incontinent liquid drip by controlling the displacement speed of the piston of the electric pump.

The method for preventing the incontinent liquid drip will be explained in further detail on the basis of flow charts shown in FIGS. 18 to 20. It is assumed that the electric pump 74 is already completed for the suction of the coating liquid on the basis of the instruction signal from the control unit 26, and the predetermined amount of the coating liquid is charged in the chamber 116.

When the discharge operation of the coating liquid is instructed for the electric pump 74, the execution of the control program is started. The viscosity instruction signal and the surface tension instruction signal, which are set for the coating liquid as the fluid, are read by the control unit 26. As a result, the fluid characteristic is set corresponding to the fluid to be used (step S21).

After the execution of the step S21, the opening/closing valve 76 is controlled to be in a fully open state.

After the control of the fully open state of the opening/closing valve 76 following the step S21, the corresponding operation control pattern is read from ROM 34 on the basis of the viscosity instruction signal and the surface tension instruction signal read for the coating liquid. The operation control pattern is transferred to unillustrated RAM, and it is stored therein (step S22).

The operation control pattern includes a flow rate control pattern for controlling the flow rate of the fluid on the basis of the displacement amount of the piston 72 with respect to the elapsed time from the discharge operation instruction time $t_0$. The operation for setting the flow rate control pattern is performed in the same manner as in the foregoing embodiment, detailed explanation of which will be omitted.

Following the step S22, the routine waits for the discharge stop operation instruction to the electric pump 74 (step S23). If the discharge stop operation instruction is given, the time measurement is started by using the timer means 36 (step S24). The displacement speed of the piston 72 is controlled so that the flow line of the fluid discharged from the nozzle is in the constricted state in accordance with the displacement speed of the piston at which no pressure pulsation occurs on the basis of the flow rate control pattern as described above (step S25).

That is, as shown in FIG. 8, the displacement amount of the piston 72 is controlled from the discharge stop operation instruction time $t_0$ to the time $t_1$ so that the flow rate changes in the downward slanting curve to the right on the basis of the preset acceleration "a" (step S25a). The displacement amount of the piston 72 is read on the basis of the counted value supplied from the pulse counter 28 (step S25b) to check whether or not the flow rate is $Q_1$ on the basis of the displacement speed of the piston 72 (step S25c). If the flow rate does not arrive at $Q_1$, the routine returns to the step S25a.

After the flow rate of the fluid discharged from the electric pump 74 within the unit time is $Q_1$ corresponding to the displacement amount of the piston 72, the displacement speed of the piston 72 is controlled from the time $t_1$ to the time $t_2$ so that the flow rate changes in the downward slanting straight line to the right on the basis of the preset displacement speed "v" (step S25d). It is checked whether or not the flow rate is $Q_2$ on the basis of the read displacement speed of the piston 72 (steps S25e, S25f).

Further, the displacement speed of the piston 72 is controlled from the time $t_2$ to the time $t_3$ so that the flow rate changes in the upward slanting curve to the right on the basis of the preset acceleration "-a" (step S25g). It is checked whether or not the flow rate is $Q_3$ on the basis of the displacement position of the piston 72 read from the counted value obtained by the pulse counter 28 (steps S25h, S25i).

After the flow rate is $Q_3$, the displacement of the piston 72 is stopped, and the predetermined time is allowed to elapse (step S25j). The predetermined time (referring to the period of time from the time $t_3$ to the time $t_4$ shown in FIG. 8) is arbitrarily set in order to correct the response error caused, for example, by the elasticity due to expansion or contraction of the piping or the gas contaminated in the fluid. The longer the predetermined time is, the larger the allowance for the response error is.

Subsequently, it is checked whether or not the flow line of the fluid discharged from the nozzle 18 is in the constricted state on the basis of the displacement speed of the piston 72 calculated from the counted value obtained by the pulse counter 28 (steps S26, S27). If it is judged that the displacement position of the piston 72 does not arrive at the predetermined position, then reference is made to the flow rate control pattern, and the displacement position of the piston 72 corresponding to the next time measurement timing to be effected by the timer means 36 is read from the flow rate control pattern (step S28). A difference is determined between the displacement position of the piston 72 read in the step S28 and the displacement position of the piston 72 based on the counted value obtained by the pulse counter (step S29). The current value control signal is fed to the current amplifier 30 on the basis of the difference determined in the step S29 (step S30).

The current having the current value outputted from the current amplifier 30 which has received the current value control signal is fed to the electromagnetic coil 96 of the electric pump 74 to control the displacement speed of the piston 72. If it is judged that the preset next time measurement timing arrives, the procedure is repeatedly executed again from the step S26 after the step S31.

The repeated execution is successively effected in a repeated manner for the control of the displacement speed of the piston 72 (deceleration of the displacement speed of the piston 72) until it is judged in the step S27 that the displacement position of the piston 72 arrives at the state in which the flow line of the fluid is constricted.

If the piston 72 stops the displacement, and the predetermined time elapses to arrive at the time $t_4$ (see FIG. 8), then the unillustrated valve plug of the opening/closing valve 76 is quickly displaced in the valve-closing direction on the basis of the quick valve-closing operation signal outputted from the control unit 26 (step S32). It is preferable that the operation for quickly displacing the unillustrated valve plug in the valve-closing direction is performed by using the load mode in order to reliably obtain the seal performance effected by the valve plug. The operation is performed after the flow rate of the fluid is sufficiently throttled. Therefore, it is possible to neglect the influence on the incontinent liquid drip of the fluid.

After the passage of the predetermined time, it is checked whether or not the unillustrated valve plug of the opening/closing valve 76 arrives at the closed position. When the valve plug is seated on the seat section, the operation control pattern comes to an end (steps S33, S34).

The other function and effect are the same as those obtained in the foregoing embodiment, detailed explanation of which is omitted.

What is claimed is:

1. An incontinent liquid drip-preventative method for preventing occurrence of incontinent liquid drip of a fluid from a discharge port when a flow of said fluid supplied from a fluid supply source is shut off, said incontinent liquid drip-preventative method comprising the steps of:
   determining an operation control pattern comprising a velocity and acceleration of said fluid flowing through a fluid passage;
   controlling a flow amount of said fluid flowing through said fluid passage so that said fluid flows according to said operation control pattern until a flow line of said fluid discharged from said discharge port attains a predetermined constricted state;
   maintaining said predetermined constricted state for a preset time period; and
   closing said fluid passage so that said flow amount of said fluid becomes zero after said flow line of said fluid discharged from said discharge port has been in said predetermined constricted state for said preset time period.

2. An incontinent liquid drip-preventative method for preventing occurrence of incontinent liquid drip of a fluid from a discharge port when a flow of said fluid supplied from a fluid supply source is shut off, said incontinent liquid drip-preventative method comprising the steps of:
   determining an operation control pattern comprising a velocity and acceleration of said fluid flowing through a fluid passage dependent on a lift amount of a valve plug for closing said fluid passage with respect to time;
   controlling said lift amount so that said filled flowing through said fluid passage flows according to said operation control pattern from initiation of a valve-closing operation instruction until arrival at a preset quick valve-closing operation position at which a flow lime of said fluid discharged from said discharge port attains a predetermined constricted state, in accordance with a driving action of an electric actuator;
   maintaining said predetermined constricted state for a preset time period; and
   controlling said valve plug to close said fluid passage, wherein said valve plug moves to a closed position after said arrival at said quick valve-closing operation position and after said flow line of said fluid discharged from said discharge port has been in said predetermined constricted state for said preset time period.

3. The incontinent liquid drip-preventive method according to claim 2, wherein said lift amount of said valve plug with respect to said period of time from said valve-closing operation instruction time for said opening/closing valve to said arrival at said quick valve-closing operation position at which said flow line of said fluid discharged from said discharge port is in said constricted state is controlled in accordance with a plurality of operation control patterns stored in a memory corresponding to characteristics of said fluid.

4. The incontinent liquid drip-preventive method according to claim 2, wherein a lift position of said valve plug is controlled in a valve-closing direction by controlling an amount of electric power application to said electric actuator for driving said valve plug of said opening/closing valve in accordance with an operation control pattern.

5. The incontinent liquid drip-preventive method according to claim 2, wherein a displacement speed of said valve plug from said valve-closing operation instruction time for said opening/closing valve to said arrival at said preset quick valve-closing operation position at which said flow line of said fluid discharged from said discharge port is in said constricted state is set to give a flow rate immediately before said fluid is discontinuous without causing any pressure pulsation.

6. The incontinent liquid drip-preventive method according to claim 2, wherein a flow rate characteristic from said valve-closing operation instruction time for said opening/closing valve to said arrival at said quick valve-closing operation position at which said flow line of said fluid discharged from said discharge port is in said constricted state is set by a displacement speed and an acceleration calculated from said lift amount of said valve plug of said opening/closing valve.

7. An incontinent liquid drip-preventative method for preventing occurrence of incontinent liquid drip of a fluid from a discharge port when a flow of said fluid supplied from a fluid supply source is shut off, said incontinent liquid drip-preventative method comprising the steps of;
   determining an operation control pattern comprising a velocity and acceleration of said fluid flowing through a fluid passage dependent on a displacement amount of a piston of a pump with respect to time;
   controlling said displacement amount of said piston so that said fluid flowing through said fluid passage flows according to said operation control pattern from initiation of a discharge stop operation instruction for said pump until a flow line of said fluid discharged from said discharge port attains a predetermined constricted state, in accordance with a driving action of said pump;

maintaining said predetermined constricted state for a preset time period; and controlling a valve plug of an opening/closing valve to close said fluid passage, wherein said valve plug moves to a closed position after said flow line of said fluid discharged from said discharge port has been in said predetermined constricted state for said preset time period.

8. The incontinent liquid drip-preventive method according to claim 7, wherein said displacement amount of said piston with respect to said period of time from said discharge stop operation instruction time for said pump until said flow line of said fluid discharged from said discharge port is in said constricted state is controlled in accordance with a plurality of operation control patterns stored in a memory corresponding to characteristics of said fluid.

9. The incontinent liquid drip-preventive method according to claim 7, wherein a displacement speed of said piston is controlled by controlling an amount of electric power application to said pump in accordance with an operation control pattern.

10. The incontinent liquid drip-preventive method according to claim 7, wherein a displacement speed of said piston from said discharge stop operation instruction time for said pump until said flow line of said fluid discharged from said discharge port is in said constricted state is set to give a flow rate immediately before said fluid is discontinuous without causing any pressure pulsation.

11. The incontinent liquid drip-preventive method according to claim 7, wherein a flow rate characteristic from said discharge stop operation instruction time for said pump until said flow line of said fluid discharged from said discharge port is in said constricted state is set by a displacement speed and an acceleration calculated from said displacement amount of said piston.

12. An incontinent liquid drip-preventative system comprising:

a fluid supply source for supplying a fluid at a constant velocity;

an opening/closing valve for controlling a flow rate of said fluid flowing through a fluid passage by displacing a valve plug to open and close said fluid passage in accordance with a driving action of an electric actuator;

a memory stored with a plurality of operation control patterns each comprising a velocity and acceleration for a fluid flowing through said fluid passage, said operation control patterns corresponding to different fluid characteristics of respective fluids, for controlling a lift amount of said valve plug with respect to time from initiation of a valve-closing operation instruction for said opening/closing valve until arrival at a preset quick valve-closing operation position at which a flow line of said fluid discharged from a discharge port attains a predetermined constricted state, for maintaining said predetermined constricted state for a preset time period, and for controlling said valve plug to close said fluid passage, wherein said valve plug moves to a closed position after said arrival at said quick valve-closing operation position and after said flow line of said fluid discharged from said discharge port has been in said predetermined constricted state for said preset time period; and a control mechanism for controlling an amount of electric power applied to said electric actuator in accordance with said operation control pattern read from said memory, so that a lift position of said valve plug is controlled in a valve-closing direction.

13. The incontinent liquid drip-preventive system according to claim 12, wherein said control mechanism includes a lift-detecting section for detecting said lift position of said valve plug, a difference-computing section for determining a difference between said lift position of said valve plug detected by said lift-detecting section and a lift position of said valve plug based on said operation control pattern, and a current amount control section for feeding an amount of current based on said difference determined by said difference-computing section, to said electric actuator for driving said opening/closing valve.

14. The incontinent liquid drip-preventive system according to claim 13, wherein said lift-detecting section includes an encoder for detecting a displacement amount of said valve plug of said opening/closing valve, and a counter for performing counting operation for an output of said encoder.

15. An incontinent liquid drip-preventative system comprising:

a fluid supply source for supplying a fluid at a constant velocity;

a pump for controlling a discharge amount of said fluid sucked from said fluid supply source by controlling a displacement amount of a piston in accordance with an applied electric power;

an opening/closing valve for opening and closing a fluid passage by displacing a valve plug;

a memory stored with a plurality of operation control patterns each comprising a velocity and acceleration for a fluid flowing through said passage, said operation control patterns corresponding to different fluid characteristics of respective fluids, for controlling a displacement amount of said piston with respect to time from initiation of a discharge stop operation instruction for said pump until a flow line of said fluid discharged from a discharge port attains a predetermined constricted state, for maintaining said predetermined constricted state for a preset time period, and for controlling said valve plug to close said fluid passage, wherein said valve plug moves to a closed position after said flow line of said fluid discharged from said discharge port has been in said predetermined constricted state for said preset time period; and a control mechanism for controlling an amount of electric power applied to said pump in accordance with said operation control pattern read from said memory, so that said displacement amount of said piston is controlled.

16. The incontinent liquid drip-preventive system according to claim 15, wherein said control mechanism includes a detecting section for detecting a displacement position of said piston, a difference-computing section for determining a difference between said displacement position of said piston detected by said detecting section and a displacement position of said piston based on said operation control pattern, and a current amount control section for feeding an amount of current based on said difference determined by said difference-computing section, to said pump.

17. The incontinent liquid drip-preventive system according to claim 16, wherein said detecting section includes an encoder for detecting said displacement amount of said piston, and a counter for performing counting operation for an output of said encoder.

* * * * *